United States Patent

Hashimoto et al.

[11] Patent Number: 5,811,655
[45] Date of Patent: Sep. 22, 1998

[54] DELAY TIME CALIBRATION CIRCUIT AND METHOD

[75] Inventors: Shinichi Hashimoto; Atsushi Saito, both of Tokyo, Japan

[73] Assignee: Advantest Corp., Tokyo, Japan

[21] Appl. No.: 711,340

[22] Filed: Sep. 5, 1996

[30] Foreign Application Priority Data

Sep. 11, 1995 [JP] Japan .................................... 7-258136

[51] Int. Cl.[6] .................................................. G01R 33/28
[52] U.S. Cl. ........................................... 73/1.42; 333/139
[58] Field of Search ........... 73/5, 6, 1.42; 324/765–769, 324/601, 74; 333/138, 139, 1

[56] References Cited

U.S. PATENT DOCUMENTS 4,497,056  1/1985  Sugamori .

Primary Examiner—Robert Raevis
Attorney, Agent, or Firm—Muramatsu & Associates

[57] ABSTRACT

A delay time calibration circuit reduces timing skews among a plurality of test channels of a semiconductor test system for testing a semiconductor device. The delay time calibration circuit includes: a plurality of calibration loops each of which includes one of the test channels, each of the calibration loop has a variable delay element; a pulse generator which provides a pulse signal to each of the calibration loops; a measuring circuit for measuring the signal propagation delay time in each of the calibration loops by monitoring a propagation delay time of the pulse signal in the calibration loop; where each of the calibration loops includes an output terminal of a pin electronics board for each of the test channels which supplies a test signal to said semiconductor device at the output terminal, and where the variable delay element is adjusted so that the signal propagation delay in each of the calibration loops becomes a constant value based on the value measured by the measuring circuit.

8 Claims, 3 Drawing Sheets

DELAY TIME CALIBRATION CIRCUIT AND METHOD

FIELD OF THE INVENTION

This invention relates to a delay time calibration circuit and its calibration method to be used in a semiconductor test system, and more particularly, to a reference delay time calibration circuit which is capable of minimizing timing skews among a plurality of test channels at points closest to a device to be tested and to a method of minimizing the timing skews.

BACKGROUND OF THE INVENTION

In testing a semiconductor device by a semiconductor test system such as an IC tester, test signals are supplied to each pin of the semiconductor device and the resulted output of the semiconductor device under test is compared with expected data to determine whether the semiconductor device functions correctly or not. For this purpose, the semiconductor test system has a large number of test channels corresponding to the number of pins of the semiconductor device to be tested.

Each test channel has an identical circuit structure including a pin electronics board which interfaces the semiconductor test system with the semiconductor device to be tested. However, because of the differences in physical position of the test channels or fluctuations in performance in circuit components, signal propagation delay times for corresponding pins of the device are not exactly the same. Moreover, because of the temperature differences such as caused by differences in the test signal frequencies or physical position in the test system, or different reactions in circuit components in response to the temperature, the delay times in the test channels vary depending on the temperature differences.

Within the context of this invention, such a difference in the signal propagation delay time is called a timing skew. To fully evaluate modern semiconductor devices, such timing skews must be minimized since such semiconductor devices operate in a timing sensitive manner among various signals. Therefore, this invention relates to a circuit arrangement and method for reducing the timing skew in the semiconductor test system.

FIG. 3 shows an example of circuit structure for measuring and adjusting timing skews in a semiconductor test system designed by the same assignee of the present invention. Pin electronics boards $60_a$–$60_n$ are provided at the ends of the corresponding test channels in the semiconductor test system 10 of FIG. 3. The semiconductor test system 10 also includes a timing generator 90 and a signal distributor 84 as a part of the circuitry for testing a semiconductor device. However, FIG. 3 shows a calibration circuit wherein the above components are included in closed loops, i.e., feedback circuits to measure and calibrate the timing skews.

The calibration circuit includes a delay time counter 82, an OR gate and a controller 86. Each of the closed loop includes the OR gate, the distributor 84, the pin electronics board 60 and the delay time counter 82. In the distributor 84, an output signal from the OR gate is distributed to terminals $79_a$–$79_n$ through a buffer 76 and delay elements $78_a$–$78_n$. The output signal from the OR gate is distributed to selected one of the terminals $79_a$–$79_n$ by switching means (not shown) controlled by the controller 86. Each output of the terminals $79_a$–$79_n$ is connected to a corresponding input terminal 51 of the pin electronics board 60 through a coaxial cable 40. In this example, in each pin electronics board 60, a delay element 55 is provided between gates 52 and 56. A gate 53 is to return the received signal at the input terminal 51 to a coaxial cable 45 which is connected to the delay time counter 82.

Therefore, a feedback loop is formed for each test channel through which a pulse signal from the timing generator circulates by a time in proportion to a signal propagation delay time in the loop. The delay time in the loop is adjusted by the delay element 78 to be equal to the delay time in the other closed loop. For example, for the pin electronics board 60a, a closed loop is formed by the OR gate 75, the buffer 76, the delay element $78_a$, the coaxial cable $40_a$, the gate $53_a$ in the board $60_a$, the coaxial cable 45 and the delay time counter 82.

By providing a reference pulse from the timing generator 90, the delay time counter 82 measures the signal propagation delay time from the OR gate 75 to the terminal $54_a$. Since the returned reference pulse is fed into the closed loop, the closed loop oscillates by the frequency determined by the propagation delay time in the closed loop. Such a delay time may be measured by counting the number of pulses in a unit time, i.e., the frequency in the closed loop. The delay time in this loop is adjusted to a standard delay time $T_{STD}$ by the delay element $78_a$. Under the control of the controller 86, the delay time in the next test channel is adjusted to be equal to the standard delay time $T_{STD}$. This process is continued until all the loops corresponding to the pin electronics boards $60_a$–$60_n$ are adjusted in the same manner.

In this technology used by the assignee of this invention, in each pin electronics board 60, a delay time from the input terminal 51 to the output terminal 69 is adjusted to be a predetermined time by varying the delay element 55. Such an adjustment is made, for example, before assembling the pin electronics boards 60 in the semiconductor test system. In other words, the delay time in the path including the gate 52, delay element 55 and gate 56 is not included in the adjustment of the closed loop but is adjusted separately.

Although the delay times in the pin electronics boards 60 are adjusted to the fixed value before the assembly, delay times in the gates $52_a$–$52_n$, the delay elements $55_a$–$55_n$, and the gates $56_a$–$56_n$ are affected differently by ambient temperature or temperature caused by their heat dissipations. The test signals actually used for testing the semiconductor device are applied to the device at the terminals $69_a$–$69_n$. Thus, the timing skews at the terminal $69_a$–$69_n$ must be considered to accurately test the semiconductor device. However, because of the temperature differences in the delay times in the gates $52_a$–$52_n$, the delay elements $55_a$–$55_n$, and the gates $56_a$–$56_n$ as noted above, accurate calibrations of the timing skews at the terminals $69_a$–$69_n$ are not attainable with high resolution and accuracy.

SUMMARY OF THE INVENTION

It is, therefore, an object of the present invention to provide a reference delay time calibration circuit which is capable of minimizing timing skews among a plurality of test channels of a semiconductor test system at points closest to a device to be tested.

It is another object of the present invention to provide a method of adjusting timing skews among a plurality of test channels of a semiconductor test system to minimize a signal propagation time difference between the test channels.

The delay time calibration circuit of the present invention is to form a calibration loop which is a closed loop for measuring and adjusting the signal propagation delay time which includes the output terminal of the pin electronics board which are closest to the device to be tested.

One aspect of the present invention is a delay time calibration circuit which reduces timing skews among a plurality of test channels of a semiconductor test system for testing a semiconductor device. The delay time calibration circuit the present invention includes: a plurality of calibration loops each of which includes one of the test channels, each of the calibration loop has a variable delay element for adjusting the signal propagation delay time in the test channel; a pulse generator which provides a pulse signal to each of the calibration loops; a measuring circuit for measuring the signal propagation delay time in each of the calibration loops by monitoring a propagation delay time of the pulse signal in the calibration loop; where each of the calibration loops includes an output terminal of a pin electronics board in each of the test channels, and the pin electronics board supplies a test signal to said semiconductor device at the output terminal, where the variable delay element is adjusted so that the signal propagation delay in each of the calibration loops becomes a constant value based on the value measured by the measuring circuit.

Another aspect of the present invention is a method of adjusting timing skews among a plurality of test signal paths in a system such as a semiconductor test system to minimize a signal propagation time difference between the signal paths. The calibration method of the present invention includes the steps of: forming a plurality of calibration loops each of which includes one of the signal paths where each of the calibration loops has an output terminal of each of the signal paths; supplying a pulse signal to each of the calibration loops; measuring a signal propagation delay time in each of the calibration loops by monitoring a propagation delay time of the pulse signal in the calibration loop; adjusting a delay time of a variable delay element which is provided in each of the signal paths such that the signal propagation delay in each of the calibration loops becomes a constant value based on the measured delay time of the pulse signal.

According to the present invention, the delay time in each test channel is adjusted by a calibration loop which includes the output terminal of the pin electronics board which is closest to the device under test. Therefore, the timing variations by the circuit components in the performance boards, such as caused by the temperature changes, do not affect the overall timing skews between the test channels. Thus, the present invention is effective to considerably improve the timing accuracy in the semiconductor device testing.

DETAILED DESCRIPTION OF THE PREFERRED EMBODIMENT

Figure 1:
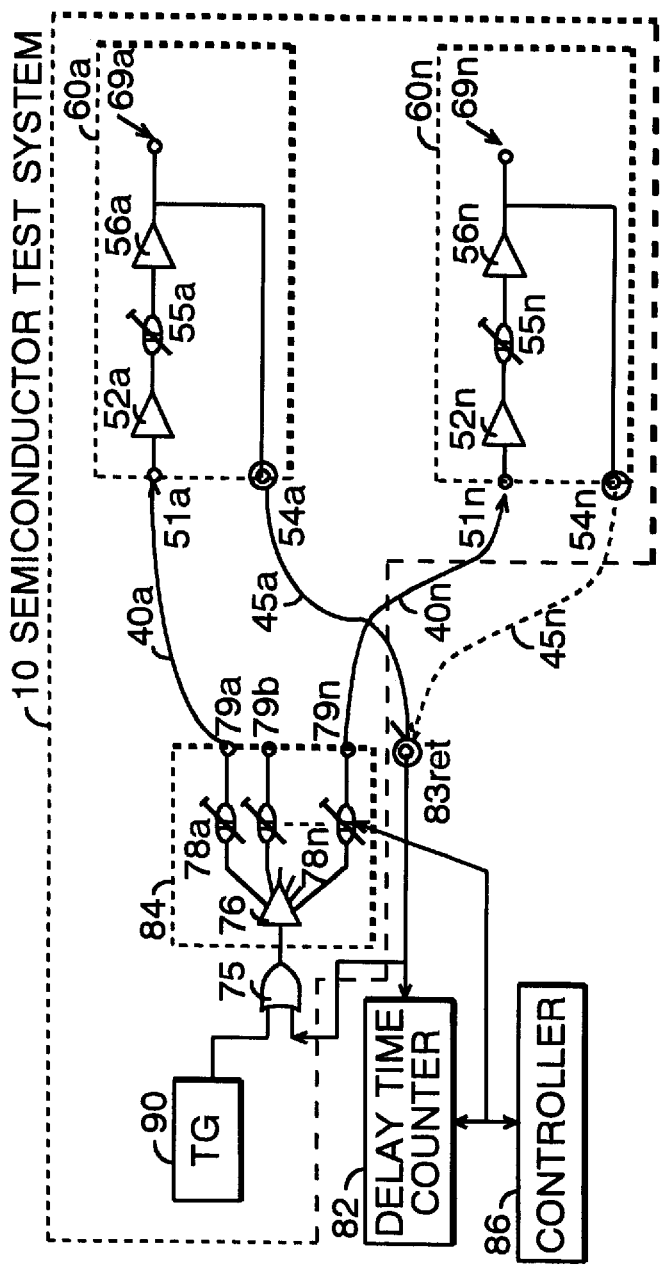
FIG. 1 is a circuit diagram showing an example of a delay time calibration circuit of the present invention.

FIG. 1 shows an example of a delay time calibration circuit of the present invention. In this example, to form a feedback loop for measuring a signal propagation delay time, a signal is picked at the closest point of an output terminal 69 of a pin electronics board 60. The same reference numerals as used in FIG. 3 designate the corresponding components in FIG. 1.

A calibration loop in FIG. 1 is formed of the delay time counter 82, the OR gate 75, the buffer 76, the delay element $78_n$, the coaxial cable $40_n$, the gate $52_n$, the delay element $55_n$, the gate $56_n$, and the coaxial cable $45_n$. In the same way as in the example of FIG. 3, a signal propagation delay time in each closed loop is adjusted to a predetermined delay time.

Namely, a feedback loop is formed for each test channel through which a pulse signal from the timing generator circulates in response to a delay time in the loop. The delay time in the loop is adjusted by the delay element 78 to be equal to a standard delay time or the delay time in the other closed loop. For example, for the pin electronics board $60a$, a closed loop is formed by the OR gate 75, the buffer 76, the delay element $78_a$, the coaxial cable $40_a$, the gate $52_a$, the delay element $55_a$, the gate $56_a$, and the coaxial cable $45_a$. and the delay time counter 82.

Figure 3:
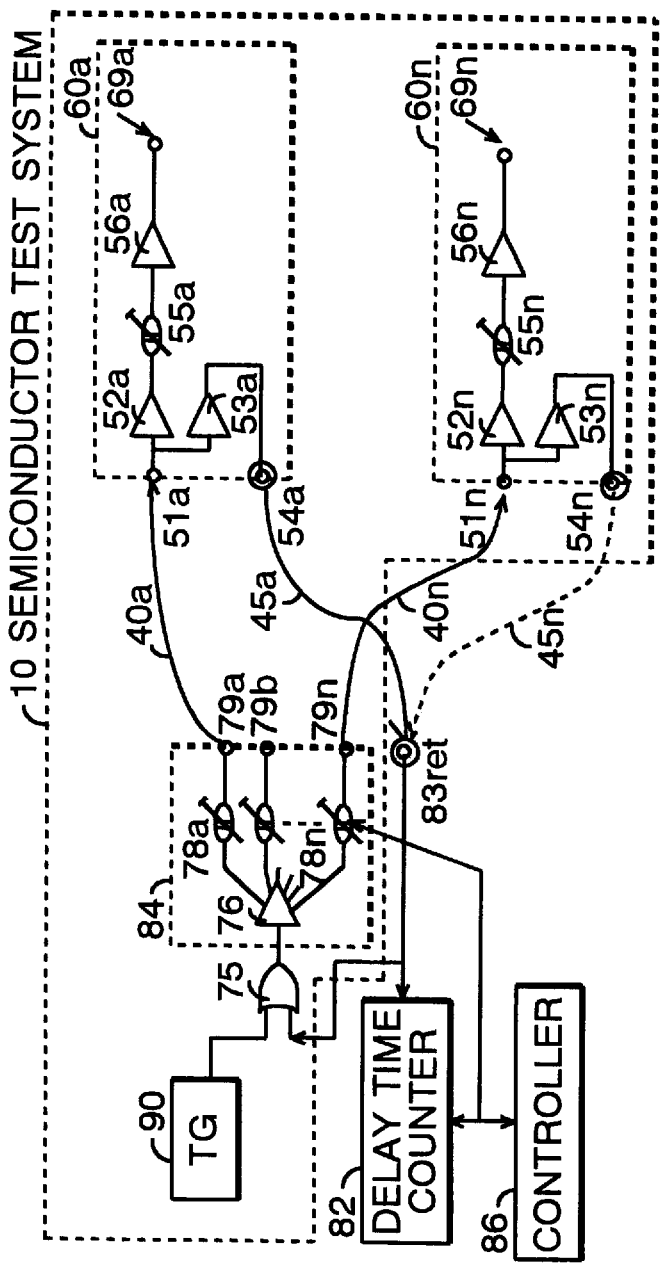
FIG. 3 is a circuit diagram showing an example of a delay time calibration circuit which is known to the assignee of the present invention.

By providing a reference pulse from the timing generator 90, the oscillation occurs as explained with reference to FIG. 3 as a function of the signal propagation delay time of the closed loop, and the delay time counter measures the signal propagation delay time including the time from the OR gate 75 to the output of the gate $56_a$. As is well known in the art, such a measurement is made by counting the frequency or time interval of the oscillation signal. The delay time in this loop may be adjusted to a standard delay time $T_{STD}$ by controlling the delay element $78_a$. Then, under the control of the controller 86, the delay time in the next test channel is adjusted to be equal to the standard delay time $T_{STD}$. This process is continued until all the loops corresponding to the pin electronics boards $60_a$–$60_n$ are adjusted in the same manner.

Since the gates $52_a$–$52_n$, the delay elements $55_a$–$55_n$, and the gates $56_a$–$56_n$ whose signal propagation delay times are sensitive to temperature changes are included in the calibration loops, and the above calibration process may be carried out every time when it is necessary, the timing skews are minimized by canceling the differences of the signal propagation delay times. Because the calibration loop is formed so that the pulse signal is picked at the point nearest the output terminal $69n$, an IC device test is performed accurately by the semiconductor test system using the calibration circuit of the present invention.

Figure 2B:
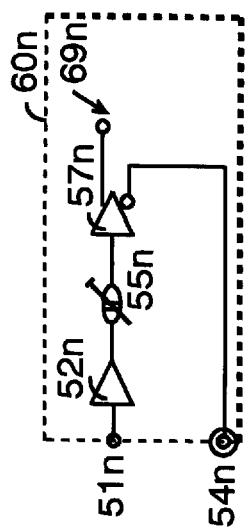
FIG. 2B is a circuit diagram of the present invention where a feedback signal for delay time measurement is picked through a gate having the same parameters as the last buffer gate of a pin electronics board.
Figure 2A:
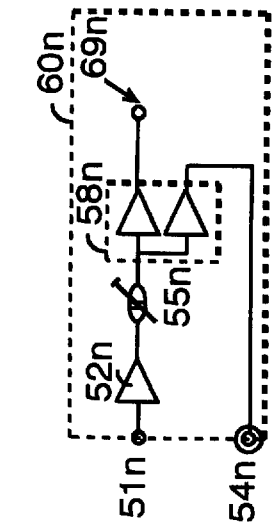
FIG. 2A is a circuit diagram of the present invention where a feedback signal for delay time measurement is picked at a differential output of the last buffer gate of a pin electronics board.

In the example of FIG. 1, the output of the gate $56n$ is connected to form the closed loop. As in FIG. 2A, it is also possible to use a differential gate $57n$ to provide one output to the terminal 69 for the device to be tested while providing the other output to the closed loop for delay time calibration. Further, as shown in FIG. 2B, it is also possible to use a pair of gates $58n$ which are in the same package and have the same parameters. One gate is connected to the terminal $69_n$ while the other gate is connected to the closed loop for the calibration.

In the foregoing, the present invention is applied to the semiconductor test system, however, other applications are also available such as a signal generator which require a plurality of timing signals and a fixed delay time for all the timing signals.

According to the present invention, the delay time in each test channel is adjusted by a calibration loop which includes the output terminal of the pin electronics board which is closest to the device under test. Therefore, the timing variations by the circuit components in the performance boards, such as caused by the temperature changes, do not affect the overall timing skews between the test channels. Thus, the present invention is effective to considerably improve the timing accuracy in the semiconductor device testing.

What is claimed is:

1. A delay time calibration circuit for adjusting signal propagation delay times in a plurality of signal paths to a constant value, comprising:

a plurality of calibration loops each of which includes one of said signal paths therein, each of said calibration loops including a variable delay element for adjusting the signal propagation delay time in said signal path;

a pulse generator which provides a pulse signal to each of said calibration loops;

a measuring circuit for measuring the signal propagation delay time in each of said calibration loops by monitoring a propagation delay time of said pulse signal in said calibration loop;

wherein each of said calibration loops includes an output terminal of each of said signal paths, and said variable delay element being adjusted so that said signal propagation delay time in each of said calibration loops becomes the same value to one another based on the value measured by said measuring circuit.

2. A delay time calibration circuit for minimizing timing skews between a plurality of test channels in a semiconductor test system which tests a semiconductor device, comprising:

a plurality of calibration loops each of which includes one of said test channels therein, each of said calibration loops including a variable delay element for adjusting the signal propagation delay time in said test channel;

a pulse generator which provides a pulse signal to each of said calibration loops;

a measuring circuit for measuring the signal propagation delay time in each of said calibration loops by monitoring a propagation delay time of said pulse signal in said calibration loop;

wherein each of said calibration loops includes an output terminal of a pin electronics board in each of said test channels, said pin electronics board supplying a test signal to said semiconductor device at said output terminal, and said variable delay element being adjusted so that said signal propagation delay in each of said calibration loops becomes the same value to one another based on the value measured by said measuring circuit.

3. A delay time calibration circuit as defined in claim 2, wherein said output terminal of said pin electronics board being connected to a gate which is a last circuit component of said pin electronics board.

4. A delay time calibration circuit as defined in claim 3, wherein said gate is a differential gate having two output terminals, one of said output terminals being connected to said output terminal while the other output terminal being connected to said calibration loop.

5. A delay time calibration circuit as defined in claim 3, wherein said gate is a pair of gates having identical parameters, one of said gates being connected to said output terminal while the other gate being connected to said calibration loop.

6. A delay time calibration circuit as defined in claim 2, wherein said pulse generator is a timing generator which generates timing signals for said semiconductor test system for forming test signals to be supplied to said semiconductor device.

7. A delay time calibration circuit as defined in claim 6, wherein said variable delay element pulse is provided in a signal distributor circuit which receives timing signals from said timing generator and distributes said timing signals to said plurality of test channels in said semiconductor test system.

8. A method of adjusting signal propagation delay times in a plurality of signal paths to a constant value, comprising the following steps of:

forming a plurality of calibration loops each of which includes one of said signal paths wherein each of said calibration loops includes an output terminal of each of said signal paths;

supplying a pulse signal to each of said calibration loops;

measuring a signal propagation delay time in each of said calibration loops by monitoring a propagation delay time of said pulse signal in said calibration loop;

adjusting a delay time of a variable delay element which is provided in each of said signal paths such that said signal propagation delay time in each of said calibration loops is adjusted to be the same value with one another based on the measured propagation delay time of said pulse signal.

* * * * *